(12) United States Patent
Taniguchi et al.

(10) Patent No.: US 6,744,257 B2
(45) Date of Patent: Jun. 1, 2004

(54) APPARATUS, A METHOD FOR TESTING AN ELECTRICAL WIRING SYSTEM, A COMPUTER PROGRAM FOR TESTING AN ELECTRICAL WIRING SYSTEM AND A COMPUTER-READABLE STORAGE MEDIUM HAVING STORED THEREON A COMPUTER PROGRAM FOR TESTING AN ELECTRICAL WIRING SYSTEM

(75) Inventors: Yoshikazu Taniguchi, Yokkaichi (JP); Setsurou Mori, Ritto (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 83 days.

(21) Appl. No.: 10/160,829

(22) Filed: May 30, 2002

(65) Prior Publication Data

US 2002/0180457 A1 Dec. 5, 2002

(30) Foreign Application Priority Data

May 30, 2001 (JP) ........................................ 2001-163088

(51) Int. Cl.$^7$ .......................... H01H 31/02; G01R 31/00
(52) U.S. Cl. ...................... 324/540; 324/539; 324/503

(58) Field of Search ................................ 324/538, 539, 324/66, 522, 525, 503, 541; 702/108, 117

(56) References Cited

U.S. PATENT DOCUMENTS

| 4,224,690 | A | * | 9/1980 | Rockwell | 714/736 |
|---|---|---|---|---|---|
| 4,597,072 | A | | 6/1986 | Somlai et al. | 370/242 |
| 4,689,551 | A | | 8/1987 | Ryan et al. | 324/539 |
| 5,155,440 | A | | 10/1992 | Huang | 324/539 |

* cited by examiner

*Primary Examiner*—N. Le
*Assistant Examiner*—Donald M Lair
(74) *Attorney, Agent, or Firm*—Gerald E. Hespos; Anthony J. Casella

(57) ABSTRACT

A method and apparatus are provided to quickly electrically test an electrical wiring system that has a large number of contacts by maximally reducing the number of electrical tests. A plurality of contacts forming a network of an electrical wiring system is divided into a plurality of groups. The respective groups are insulated from each other. The insulated states of these groups are discriminated, and the insulated states of the respective contacts in the respective groups are discriminated if the insulated states of the respective groups are judged to be satisfactory.

8 Claims, 9 Drawing Sheets

|  | N1 | N2 | N3 | N4 | N5 |
|---|---|---|---|---|---|
| G1 | T1 | T2 | T6 | | |
| G2 | | | | | |
| G3 | | | | | |
| G4 | | | | | |

(B)

|  | N1 | N2 | N3 | N4 | N5 |
|---|---|---|---|---|---|
| G1 | | | | | |
| G2 | T3 | T4 | T7 | T5 | T15 |
| G3 | | | | | |
| G4 | | | | | |

(C)

|  | N1 | N2 | N3 | N4 | N5 |
|---|---|---|---|---|---|
| G1 | | | | | |
| G2 | | | | | |
| G3 | T8 | T9 | T11 | T12 | |
| G4 | | | | | |

(D)

|  | N1 | N2 | N3 | N4 | N5 |
|---|---|---|---|---|---|
| G1 | | | | | |
| G2 | | | | | |
| G3 | | | | | |
| G4 | T10 | T13 | T14 | T16 | |

| | N1 | | | | |
|---|---|---|---|---|---|
| G1 | T1 | T2 | T6 | | |
| G2 | T3 | T4 | T7 | | |
| G3 | T8 | | T11 | | |
| G4 | T10 | T13 | | | |

(B)

| | | | N2 | | |
|---|---|---|---|---|---|
| G1 | T1 | T2 | T6 | | |
| G2 | T3 | T4 | T7 | T5 | T15 |
| G3 | | T9 | | T12 | |
| G4 | T10 | T13 | | | |

(C)

| | | | | N3 | |
|---|---|---|---|---|---|
| G1 | T1 | T2 | T6 | | |
| G2 | T3 | T4 | T7 | | |
| G3 | T8 | | T11 | | |
| G4 | | | T14 | T16 | |

(D)

| | | | | N4 | |
|---|---|---|---|---|---|
| G1 | | | | | |
| G2 | | | | T5 | T15 |
| G3 | | T9 | | T12 | |
| G4 | | | T14 | T16 | |

(E)

| | | | | | N5 |
|---|---|---|---|---|---|
| G1 | | | | | |
| G2 | | | | T5 | T15 |
| G3 | | | | | |
| G4 | | | | | |

APPARATUS, A METHOD FOR TESTING AN ELECTRICAL WIRING SYSTEM, A COMPUTER PROGRAM FOR TESTING AN ELECTRICAL WIRING SYSTEM AND A COMPUTER-READABLE STORAGE MEDIUM HAVING STORED THEREON A COMPUTER PROGRAM FOR TESTING AN ELECTRICAL WIRING SYSTEM

BACKGROUND OF THE INVENTION

1. Field of the Invention

The invention relates to an apparatus, method and a computer program for testing an electric wiring system and a computer-readable storage medium having stored thereon a computer program for testing an electric wiring system.

2. Description of the Related Art

An electric wiring system, such as a wiring harness, has a plurality of contacts that form a predetermined electric network. The contacts that are required to form a proper network are determined at the time of designing.

Electrical tests for such an electric wiring system include a dielectric strength test for testing dielectric strengths of the contacts insulated from each other and an electrical connection test for discriminating whether connected/disconnected states of the contacts form a proper network.

In these electrical tests, specific contacts to be tested normally are selected from a plurality of contacts, connected/disconnected states of all the possible combinations of the selected contacts are detected, and whether the detected connected/disconnected states are satisfactory are discriminated.

However, if an electrical test is conducted for all the possible combinations of the respective contacts, a number of tests "N" is: $N=m(m-1)$ where m denotes a total number of contacts in the case of a bilateral test. Thus, if the total number "m" of the contacts is doubled, the number of tests "N" is increased to about a square of the previous number. The number of tests increases excessively for a product having a large number of circuits (e.g. 200 circuits) due to the advanced electronization of recent electric wiring systems, and it disadvantageously takes a considerable time for the electrical tests.

In view of the above problem, an object of the present invention is to allow to quickly electrically test the electric wiring system having a large number of contacts by maximally reducing the number of electrical tests.

SUMMARY OF THE INVENTION

The invention is directed to an electrical wiring system testing apparatus for testing connected states of contacts of an electrical wiring system with a plurality of contacts that form an electric network. The system comprises a reference data storage means for storing reference data used as references in testing the connected states. The system also comprises reading means for reading the connected states of the electrical wiring system and a discriminating means for discriminating the connected states of the electrical wiring system by comparing the test data read by the reading means with the reference data stored in the reference data storage means. Contacts in the reference data are divided into a plurality of groups insulated from each other. The discriminating means first discriminates insulated states of the respective contacts among the respective groups and then discriminates in the respective groups if the insulated states of the respective groups are satisfactory.

Accordingly, the insulated states of the respective contacts are first discriminated among the respective groups (inter-group discrimination) and then discriminated in the respective groups (intra-group discrimination) if the insulated states of the respective groups are judged to be satisfactory. Thus, the total number of the tests can be reduced considerably by conducting the inter-group test as compared to a case where tests are conducted for all possible combinations of all the contacts.

The discriminating means preferably tests the respective contacts in parallel in the respective groups. Thus testing time can be shortened because the contacts divided into a plurality of groups can be tested simultaneously.

The number of the contacts in each group is set preferably using a square root of a total number of the contacts as a target value. In this way, all contacts can be tested electrically by a minimum number of tests.

The reading means preferably comprises multiplexing means to enable a multiplexing communication with the plurality of contacts. Accordingly, the testing apparatus can be more flexible for different testing applications and/or the number of buses or connections can be reduced.

A controller preferably sets the contacts to specified electrical states (e.g. pulled-up to a specified voltage level by a pull-up transistor) for allowing the test data to be read by the reading means from the contacts.

The invention also is directed to a method for testing connected states of contacts of an electrical wiring system. The method includes dividing the contacts into a plurality of groups insulated from each other based on reference data. The method proceeds with a first discriminating step (inter-group discrimination) in which insulated states of the respective contacts are discriminated among the respective groups. The method continues with a second discriminating step (intra-group discriminating step) in which it is discriminated in the respective groups if the insulated states of the respective groups are satisfactory.

The invention also is directed to a computer program containing program code means for performing all the steps of the above-described method when the program is run on a computer.

The invention also is directed to a computer-readable storage means for storing a computer program containing program code means for performing all the steps of the method when said program is run on a computer.

The invention further is directed to an electrical wiring system testing program for testing connected states of contacts of an electrical wiring system having a plurality of contacts forming an electric network or a storage medium for storing such a program. The program causes the electrical wiring system testing apparatus that comprises the reference data storage means to store the reference data used as the references in testing the connected states. A reading means reads the connected states of the electrical wiring system and a discriminating means discriminates the connected states of the electrical wiring system by comparing the test data read by the reading means with the reference data stored in the reference data storage means. More particularly, the discriminating means first discriminates the insulated states of the respective contacts among the respective groups and then discriminates them in the respective groups if the insulated states of the respective groups are judged to be satisfactory based on the reference data in which the contacts are divided into a plurality of groups insulated from each other.

The invention also is directed to a computer program product comprising program code means stored on a computer-readable medium for performing the above-described method.

In the present invention, the "electrical test" preferably refers to an electrical connection test, but it is not restricted thereto. For example, the electrical test may be a dielectric strength test for testing a dielectric strength against a high voltage/current although a proximity condition during grouping should be additionally met.

These and other objects, features and advantages of the present invention will become more apparent upon reading of the following detailed description of preferred embodiments and accompanying drawings. It should be understood that even though embodiments are described separately, single features thereof may be combined to additional embodiments.

BRIEF DESCRIPTION OF THE DRAWINGS

FIGS. 4(A) and 4(B) show a way of the electrical connection test for a wiring harness as an electrical wiring system in the embodiment of FIG. 1, wherein FIG. 4(A) is a wiring diagram showing a network of the wiring harness in a simplified manner, and FIG. 4(B) is a table showing an exemplary case where contacts of the wiring harness are grouped.

FIGS. 7(A) to 7(D) are tables showing reference data in the case of conducting the inter-group test for the wiring harness based on conditions described with respect to FIGS. 4(A) and 4(B).

FIGS. 9(A) to 9(E) are tables showing reference data in the case of conducting the intra-group test for the wiring harness based on conditions described with respect to FIGS. 4(A) and 4(B).

DETAILED DESCRIPTION OF THE PREFERRED EMBODIMENTS

Figure 1:
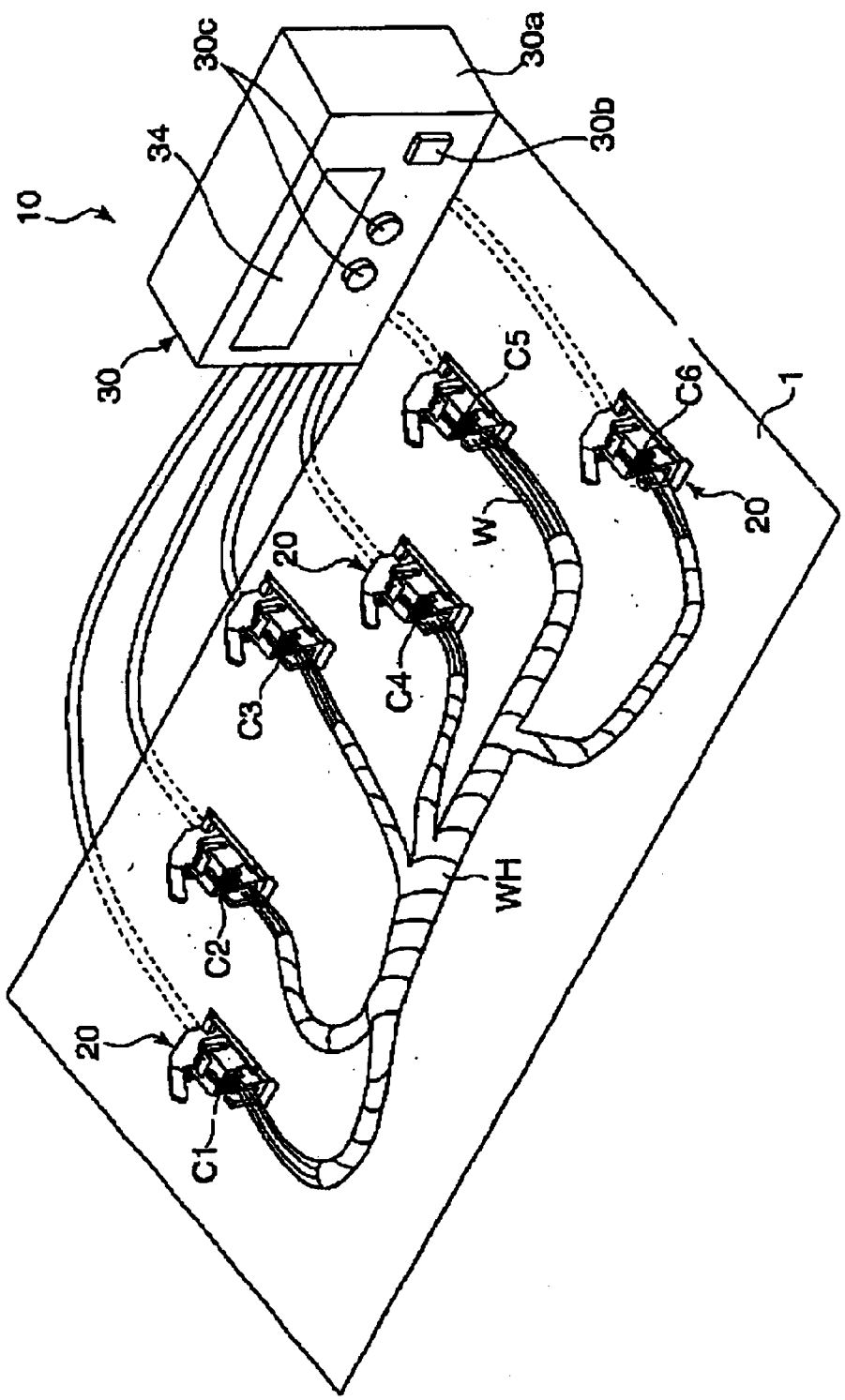
FIG. 1 is a perspective view diagrammatically showing the external construction of an electrical connection testing apparatus according to one embodiment of the present invention.

A circuit for an electrical connection testing apparatus 10 according to the invention is described with reference to FIGS. 1 and 2, and is operative for testing an electrical connection of a wiring harness WH. The electrical connection testing apparatus 10 is installed on a testing board 1 and includes connector units 20 for a plurality connectors C1 to C6 connected with the wiring harness WH to be tested, and a master unit 30 connected with the respective connector units 20 to enable a multiplexing communication (i.e. the transmission of two or more signals and/or data over a single channel).

Figure 2:
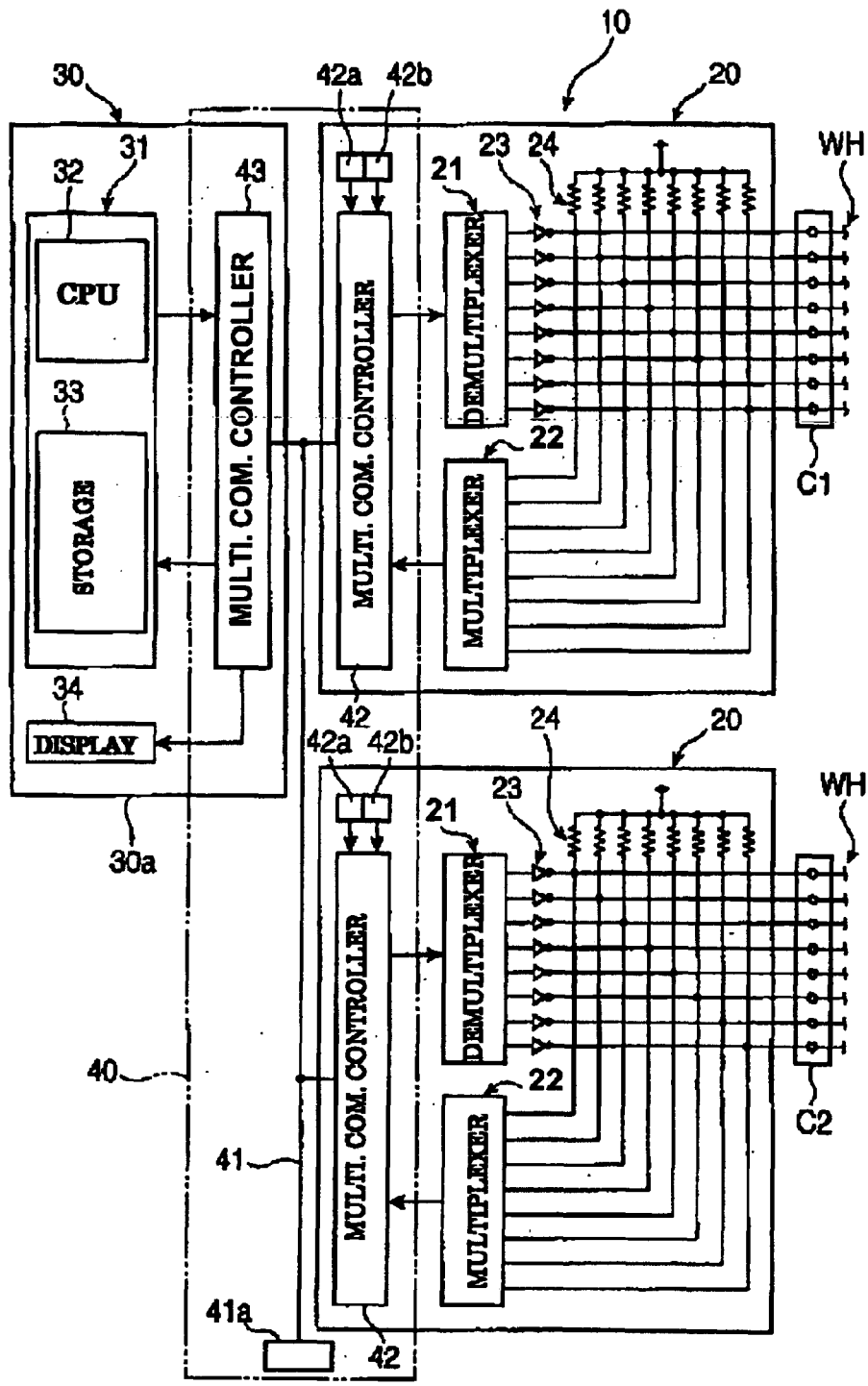
FIG. 2 is a circuit construction diagram of the electrical connection testing apparatus of FIG. 1.

Each connector unit 20 has a demultiplexer 21 with outputs that correspond to the number of contacts of a connector C1 (C2 to C6) connected as shown in FIG. 2. Each connector unit 20 also has a multiplexer 22 connected with the output of the demultiplexer 21 as a data input. A plurality of inverters 23 and a plurality of pullup resistors 24 are provided for the respective outputs of the demultiplexer 21, and unillustrated probe pins connect the outputs of the demultiplexer 21 and the connector C1 (or one of C2 to C6). Signals are outputted from the demultiplexer 21 in accordance with the output signal from the master unit 30 and pull-up currents are caused to flow via the pullup resistors 24. Thus, terminals T1 to T16 of the connector C1 (C2 to C6) connected with the connector unit 20 can be brought to an electrically active state and electrically connected states of the respective terminals T1 to T16 can be detected by the multiplexer 22.

The master unit 30 has a controller 31 for controlling the respective connector units 20. The controller 31 includes a CPU (central processing unit) 32, a storage 33 connected with the CPU 32, and a display 34 for displaying contents of processing.

The storage 33 stores an electrical connection testing program that causes the CPU 33 to function as an electrical connection testing device and an address setting program for giving node addresses of a multiplexing communication controller 43. The storage 33 also is used as a work area or virtual working memory of the CPU 32. Further, the storage 33 stores, as reference data, electrical connection information of contacts of a network to be formed in the wiring harness WH being tested and also stores read information on the wiring harness WH being tested which is obtained via a multiplexing communication system 40 to be described later as test data.

The display 34 connects with the controller 31 via the multiplexing communication controller 43 of the multiplexing communication system 40 and displays contents of controls of the controller 31. In the example of FIG. 1, the display 34 is a liquid crystal panel mounted on a casing 30a.

The connector units 20 and the master unit 30 are connected by the multiplexing communication system 40 such that a multiplexing communication can be conducted therebetween.

The multiplexing communication system 40 includes a multiplexing communication bus 41 forming a LAN (local area network) bus, multiplexing communication controllers 42 provided in the respective connector units 20, and the multiplexing communication controller 43 provided in the master unit 30. The bus 41 includes a network terminator 41a, as shown in FIG. 2.

The multiplexing communication controller 42 in each connector unit 20 has a self node address setting switch 42a and a transmission-end node address setting switch 42b. The switches 42a and 42b can set a self node address and a transmission-end node address which are different from each.

On the other hand, the CPU 32 sets the self node address and the transmission-end node address in the multiplexing communication controller 43 in the master unit 30.

Figure 3:
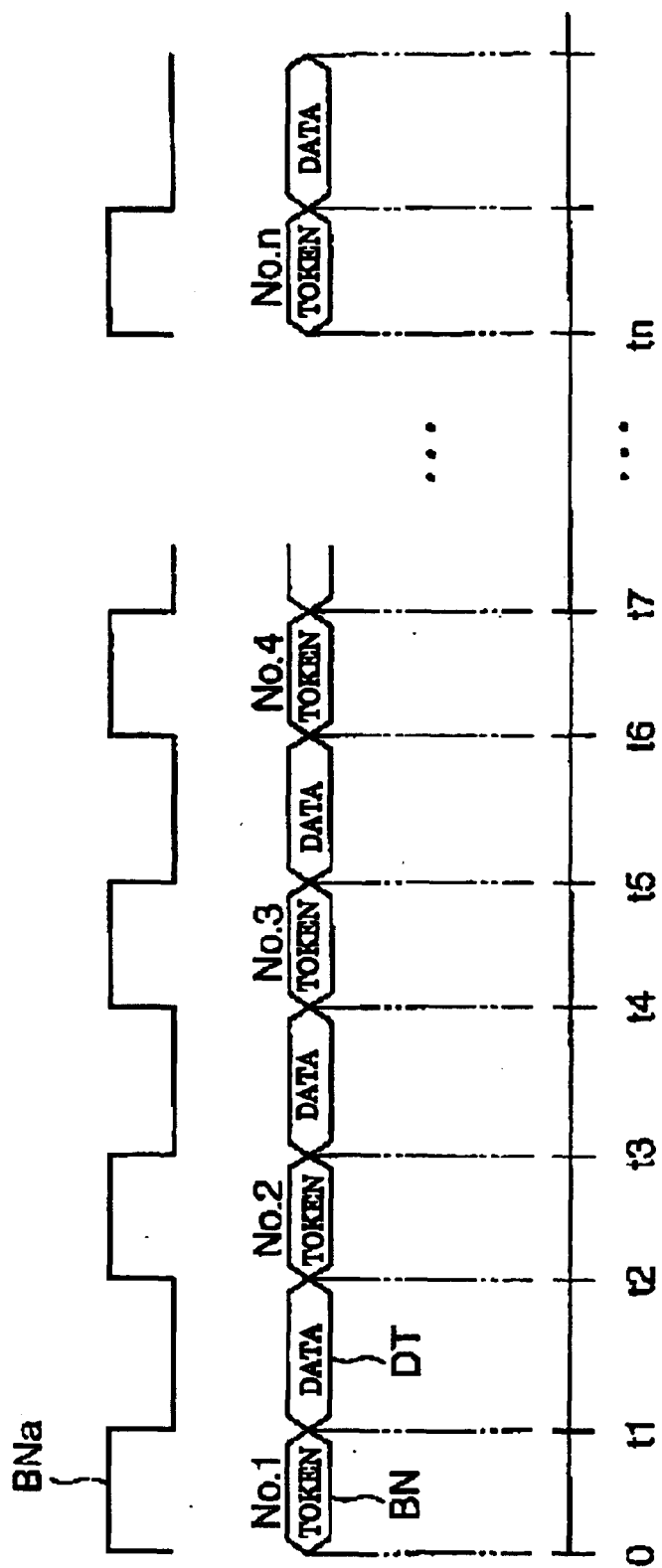
FIG. 3 is a diagram showing a state of a perfect time division multiplexing communication by a master unit of this embodiment.

FIG. 3 shows a perfect time division multiplexing communication by the master unit 30. The horizontal axis in FIG. 3 represents time, BNa and BN denote an issuing cycle of token signals by the master unit 30 and a timing bit set issued as the token signal, respectively. In the shown example, an output is made by a frequency-modulation method adopting a broadband system.

The master unit 30 repeatedly issues the token signal in a cycle of a period between 0 and t2. The master unit 30 issues the token signals as a timing marker during the front halves of the cycles 0 to t1, t2 to t3, t4 to t5, t6 to t7, etc. The units 20, 30 that have the self node address coinciding with the node address of the issued token then output a data DT to a bus B (or 41) during the rear halves of the cycles t1 to t2, t3 to t4, t5 to t6, etc. In this way, the master unit 30 conducts a perfect time division multiplexing communication in which tokens are given to all units, including itself, by successively repeating the issuance of the timing bit set BN by the number of the units. The respective units 20, 30 can output data packets between the respective timing bit sets and all units 20, 30 use the outputted data packets in the bus 41. Accordingly, the respective connector units 20 share the bit set information and simultaneously make the terminals that correspond to themselves active by outputting an electrical connection test information of all the terminal fittings T1 to T16 as one bit set information from the master unit 30.

Pieces of the read information can be outputted in parallel from the respective connector units 20 by conducting the perfect time division multiplexing communication. Thus, the elapsed response time until the read information from each connector unit is received after the output of one instruction signal from the master unit 30 can be shortened remarkably.

A circuit construction of the wiring harness WH to be tested is described with reference to FIGS. 4(A) and 4(B). The example is simplified to facilitate the description, however, an electrical connection test for the wiring harness with 960 points of contact (terminals) is supposed in this embodiment.

Figure 4:
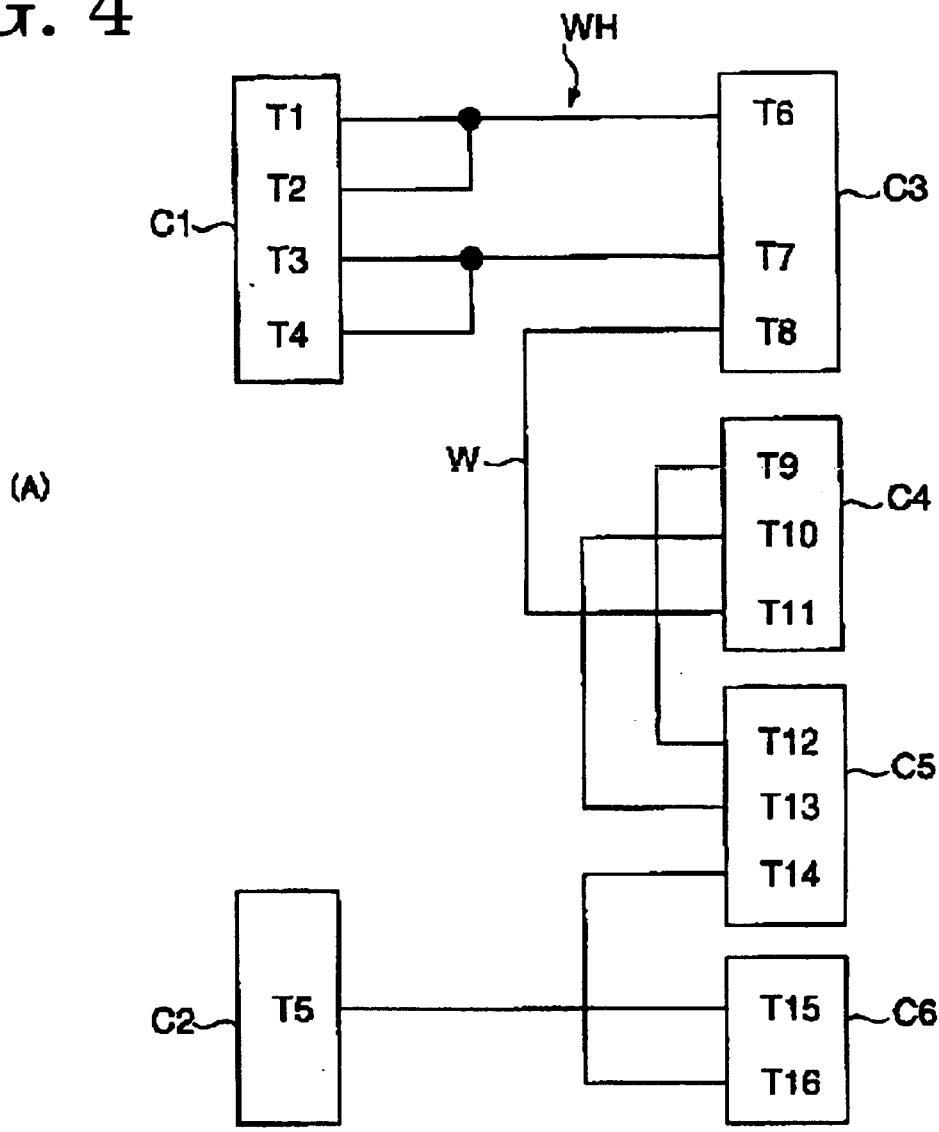

First, with reference to FIG. 4(A), the wiring harness WH is comprised of a plurality of connectors C1 to C6, the terminals T1 to T16 accommodated in the respective connectors C1 to C6, and wires W for connecting specific terminals.

In the illustrated example, the respective terminals T1 to T16 are connected in the following manner:

T1, T2 and T6 are connected with each other, but insulated from the other terminals.

T3, T4 and T7 are connected with each other, but insulated from the other terminals.

T5 and T15 are connected with each other, but insulated from the other terminals.

T8 and T11 are connected with each other, but insulated from the other terminals.

T9 and T12 are connected with each other, but insulated from the other terminals.

T10 and T13 are connected with each other, but insulated from the other terminals.

T14 and T16 are connected with each other, but insulated from the other terminals.

It is preferable to divide the respective terminals T1 to T16 into four groups G1 to G4 as shown in FIG. 4(B) to test the electrical connection of the wiring harness WH.

The terminals T1 to T16 are grouped so that the respective groups G1 to G4 are insulated from each other. For example, the terminals T1, T2 and T6 that form the group G1 are not connected electrically with the terminals of any other group G2 to G4. This also applies to the terminals T3, T4, T7, T5 and T15 that form the group G2, the terminals T8, T9, T11 and T12 that form the group G3 and the terminals T10, T13, T14 and T16 that form the group G4.

The numbers of the terminals that form the respective groups G1 to G4 are set using a square root of the total number of the terminals as a target value. The number of the terminals T1 to T16 in the illustrated example is 16, and the number of the terminals in each group is adjusted to 4 or any integer closest to 4. When N, m and n denote the total number of the terminals, the number of the groups G1 to G4, and the uniform number of the terminals in each group, respectively, the value of n which minimizes a total number of tests to be conducted is obtained as follows on the conditions that tests are first conducted for all the possible combinations of m groups and then for all the possible combinations of the terminals in the respective groups.

$$N = m \times n \quad (1)$$

An equation for a total number of tests X is:

$$X = m(m-1) + n(n-1) \quad (2)$$

By putting equation (1) into equation (2), following equation (3) is obtained.

$$X = N/n(N/n-1) + n(n-1) \quad (3)$$

Then, based on a condition to minimize the total number of tests:

$$\frac{dX}{dn} = 0 \quad (4)$$

$$\frac{dX}{dn} = N^2\left(\frac{-2n}{n^4}\right) + 2n - \left(\frac{-N}{n^2}\right) - 1 = 0 \quad (5)$$

If following equation (6) is solved for n, $$2n^4 - n^3 + Nn - 2N^2 = 0 \quad (6)$$

$$n = N^{(\frac{1}{2})} \quad (7)$$

because $n > 0$.

The number of tests is reduced in intra-group electrical connection tests because a plurality of terminals are tested simultaneously. However, the number of the terminals in each group preferably is set at a value satisfying equation (7) even in such a case.

Figure 5:
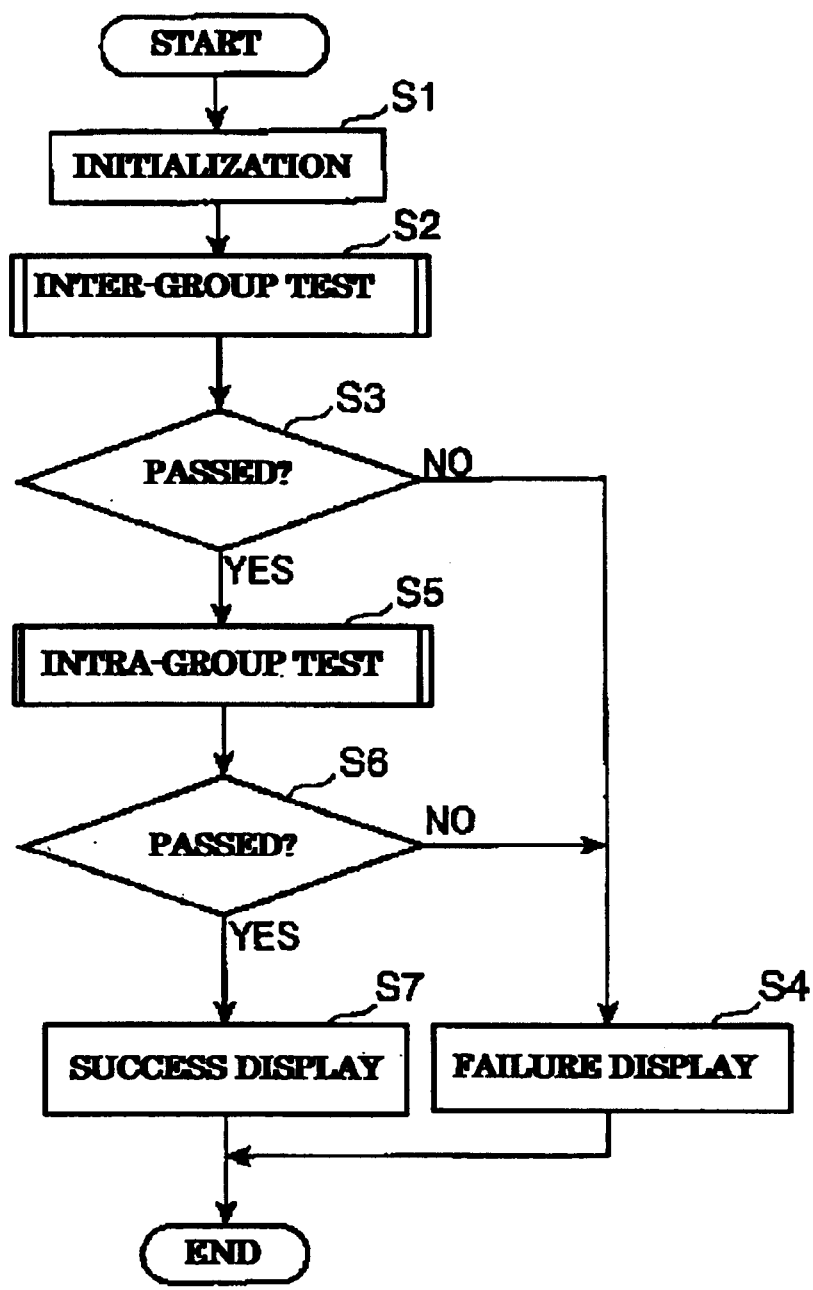
FIG. 5 is a flow chart showing a basic operation procedure of this embodiment.

The testing apparatus is used, as shown in FIG. 5, initialization by actuating a power-switch 30b to turn the apparatus on and then performing the initialization step S1. The initialization step S1 includes initializing the CPU 32 of the controller 31 and setting the product number of the wiring harness WH to be tested is set.

The controller 31 then conducts an inter-group test (Step S2) to test an insulated state among the respective groups G1 to G4 and determines whether the respective groups G1 to G4 have passed the tests (Step S3).

The controller 31 makes a failure display on the display 34 and completes this processing (Step S4) if any groups G1–G4 are determined in Step S3 to have failed the tests. On the other hand, if all the groups G1 to G4 pass the inter-group tests in Step S3, the controller 31 proceeds.

Upon completion of the inter-group test, the controller 31 conducts intra-group tests to test the electrically connected states of all possible combinations of the terminals T1 to T16 in the groups G1 to G4 (Step S5) and determines whether the terminals T1 to T16 have passed the tests (Step S6). If any failure is discriminated in the intra-group test, the controller 31 makes a failure display on the display 34 in Step S4. On the other hand, if the wiring harness WH is determined to be satisfactory, the controller 31 makes a success display on the display 34 (Step S7) and completes the processing.

The tests involve the transmission and reception of data packets between connector units 20 that are connected with the wiring harness WH being tested and the master unit 30 that is connected with the respective connector units 20 by the multiplexing communication system 40 for performing the perfect time division multiplexing communication method. In this way, each connector unit 20 outputs corresponding output signals from the demultiplexer 21 and causes the pullup currents to flow via the pullup resistors 24. Thus, the respective contacts of the connectors C1 (C2 to C6) connected with the connector unit 20 are specified selectively and brought to specified electrically active states (such as a specified voltage), and the electrically connected states of the respective contacts can be detected by the multiplexer 22.

Figure 6:
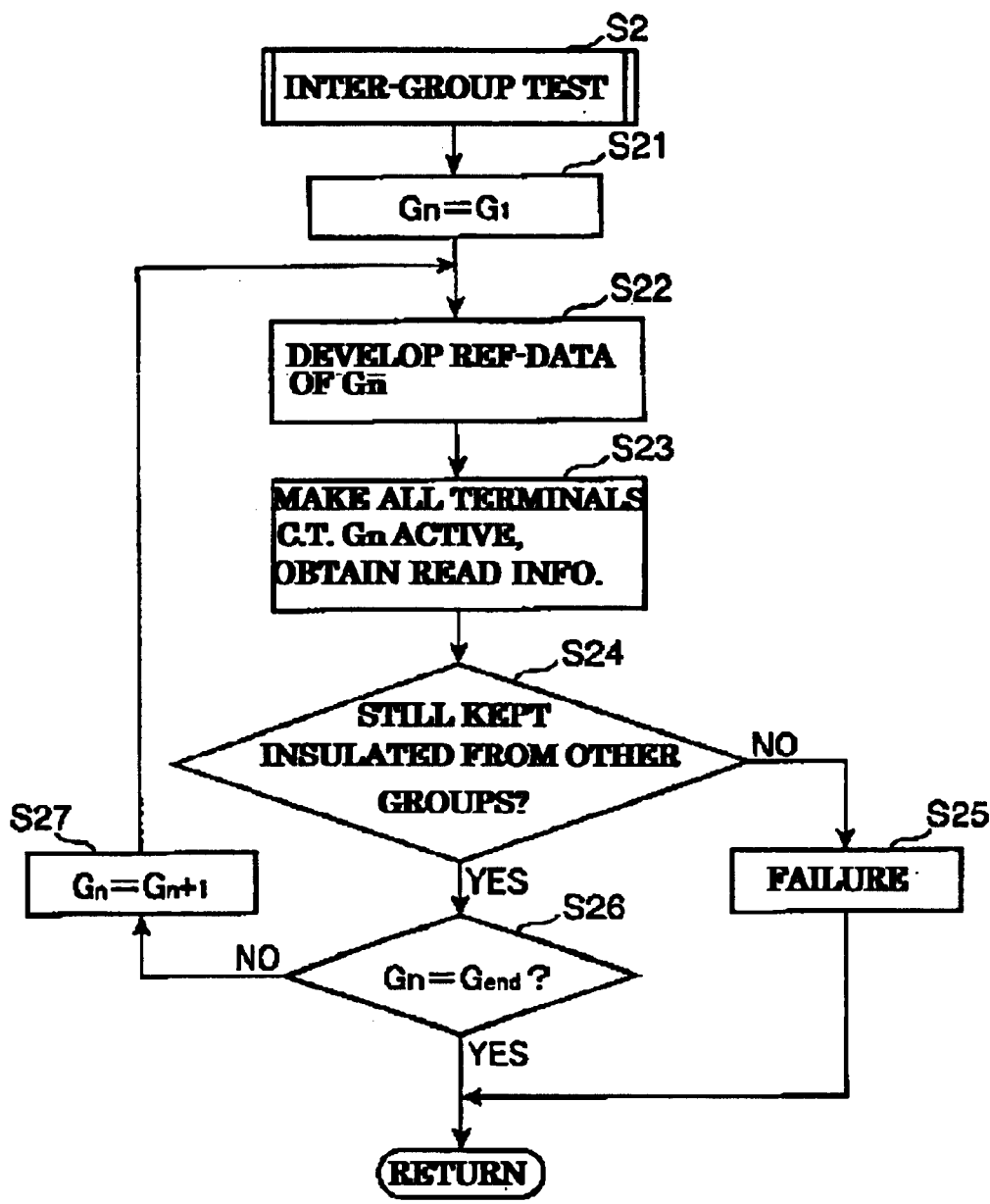
FIG. 6 is a flow chart showing the details of an inter-group test in the operation procedure of FIG. 5.

The inter-group test is started by initializing the group Gn to be tested first (Step S21 in FIG. 6) and then developing the reference data (data shown in FIGS. 7(A) to 7(D)) of the group Gn to be tested first (Step S22). FIGS. 7(A) to 7(D) show, in table format, the relationships of the respective groups G1 to G4 in their active state, where the terminals in the test group have a voltage different from the terminals in groups that are not being tested. For example, in the case of testing the group G1 all the terminals of the groups G2 to G4 are OFF (black in FIG. 7).

The controller 31 then brings all of the terminals in the group Gn being tested to the active state, and reads the electrically connected states of the terminals of the other groups to obtain the read information as a test data (Step S23). The obtained test data and the developed reference data are compared to check whether the terminals of the group Gn being tested are shorted electrically with the other terminals (step S24). In this way, the terminals that should be insulated electrically are tested simultaneously.

The inter-group test may determine that the group Gn being tested in Step S2 is shorted with the other group(s). Accordingly, a failure judgment is made (Step S25) and the subroutine returns to the main routine. Thus, the failure display (Step S4) is made and the main routine is terminated.

On the other hand, the group Gn being tested may be determined to be satisfactory. Thus, a determination is made in Step S26 whether any untested group remains. If an untested group remains, the group Gn to be tested is increased to $G_{n+1}$ (Step S27) and Step S22 follows. If there remains no untested group, this subroutine returns to the main routine.

Figure 8:
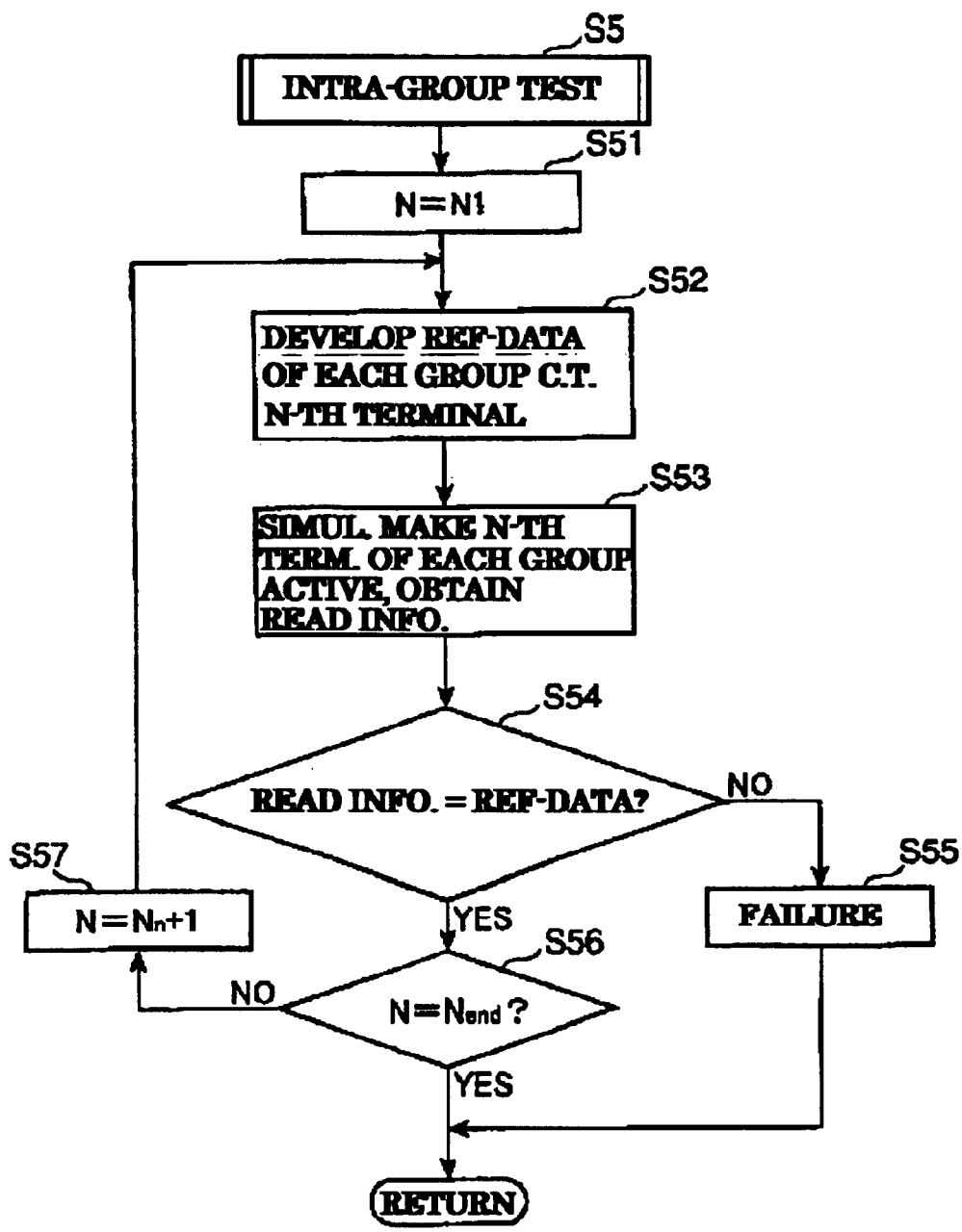
FIG. 8 is a flow chart showing the details of an intra-group test in the operation procedure of FIG. 5.

The intra-group test (step S5), illustrated in greater detail in FIGS. 8 and 9, begins by initializing the terminal to be tested first (Step S51) and then develops the reference data shown in FIGS. 9(A) to 9(E)) of that terminal (Step S52). FIGS. 9(A) to 9(E) show, in table format, relationships of the terminals being tested in their active state with the other terminals. For example, to test the terminal T1, the terminals T2, T6, which should be connected with the terminal T1, are connected electrically (see FIG. 9(A)).

The terminals of the respective groups G1 to G4 are tested simultaneously upon successively (in the order N1 to N5) testing all the possible combinations of the respective terminals T1 to T16. For example, in the first electrical connection test, the N1-th terminals T3, T8, T10 of the other groups G2 to G4 are brought to the active state simultaneously with the terminal T1 of the group G1 and all the terminals T4, T7, T11, T13 which should be connected electrically with these terminals T3, T8, T10 are registered as those to be connected electrically, as shown in FIG. 9(A). There is no problem conducting the electrical connection test with such a setting because the respective groups G1 to G4 already have been determined to be insulated from each other in the inter-group test. In this way, the intra-group tests of the groups can be conducted simultaneously.

As shown in FIG. 8, after Step S52, the controller 31 brings all the terminals being tested (T1, T3, T8, T10 in the case of FIG. 9(A)) to the active state, and reads the electrically conducted states of the other terminals to obtain the read information as a test data (Step S53). The obtained test data and the developed reference data are compared to check whether the terminals T1, T3, T8, T10 being tested are shorted electrically with the terminals other than the proper ones (black in FIG. 9) shown in FIG. 9. In this way, terminals are tested simultaneously in parallel in the respective groups.

A failure judgment is made (Step S55) and the subroutine returns to the main routine, if the terminal being tested in the intra-group test of Step S54 is detected to be shorted with a terminal from which it should be insulated. Thus, the failure is displayed (Step S4) and the main routine is terminated.

On the other hand, if the terminals being tested are determined to be satisfactory, a determination is made whether any untested terminal remain (Step S56). If an untested terminal remains, the terminal to be tested is set to $N_{n+1}$ (Step S57) and Step S52 follows. If no untested terminals remain, the subroutine returns to the main routine.

As described above, the terminals T1 to T16 of a wiring harness WH are divided beforehand into a plurality of groups G1 to G4 that are insulated from each other. The insulated states of the terminals T1 to T16 are determined first among the respective groups G1 to G4 and then in the respective groups G1 to G4 if the respective groups are judged to be insulated from each other. Thus, as compared to a case where tests are conducted for all the possible combinations of the terminals T1 to T16, the total number X of the tests can be reduced considerably by conducting the inter-group test.

The respective terminals T1 to T16 can be tested in parallel in the respective groups G1 to G4. Thus, a testing time can be shortened further.

Further, the groups G1 to G4 of the reference data are set using the square root of the total number of the terminals T1 to T16 as a target value. Thus, all the terminals T1 to T16 can be tested electrically by a minimum number of the tests as is clear from the equations (1) to (7).

The foregoing embodiment is only a specific example of the preferred embodiment of the present invention and does not restrict the present invention as defined by the claims.

For example, the electrical test may be an inter-wire voltage resistance test or an insulation resistance test as disclosed, e.g. in Japanese Unexamined Patent Publication No. 6-290843.

The master unit 30 can be formed by various computers. In such a case, the electrical connection test program can be stored in various computer-readable mediums (e.g. CD-ROM).

Needless to say, various design changes can be made without departing from the scope of the present invention as claimed.

As described above, the total number of the tests can be reduced by conducting the inter-group test, as compared to the case where tests are conducted for all the possible combinations of all contacts. Thus, the number of the electrical tests can be reduced maximally and, an electrical wiring system with a large number of contacts can be tested quickly.

What is claimed is:

1. An electrical wiring system testing apparatus for testing connected states of contacts of an electrical wiring system having a plurality of contacts forming an electric network, comprising:

a reference data storage means for storing reference data used as references in testing the connected states, a reading means for reading the connected states of the electrical wiring system to be compared with the reference data as test data from the contacts, and a discriminating means for discriminating the connected states of the electrical wiring system by comparing the test data read by the reading means with the reference data stored in the reference data storage means, wherein, based on the reference data in which the contacts are divided into a plurality of groups insulated from each other, the discriminating means first discriminates insulated states of the respective contacts among the respective groups and then discriminates in the respective groups if the insulated states of the respective groups are judged to be satisfactory, and wherein the number of the contacts included in each group is set using a square root of a total number of the contacts as a target value.

2. The electrical wiring system testing apparatus of claim 1, wherein the discriminating means at least partly tests the respective contacts in parallel in the respective groups.

3. The electrical wiring system testing apparatus of claim 1, wherein the reading means comprises multiplexing means to enable a multiplexing communication with the plurality of contacts.

4. The electrical wiring system testing apparatus of claim 3, wherein a controller sets the contacts to specified electrical states for allowing the test data to be read by the reading means from the contacts.

5. An electrical wiring system testing method for testing connected states of contacts of an electrical wiring system having a plurality of contacts forming an electric network, comprising: dividing the contacts into a plurality of groups based on reference data, such that the groups are insulated from each other, and such that the number of the contacts in each group is set using a square root of a total number of the contacts as a target value; determining, in a first discrimination step, the insulated states of the respective contacts among the respective groups; and determining, in a second discrimination step in the respective groups, if the insulated states of the respective groups are satisfactory.

6. The method of claim 5, wherein in the second discriminating step the respective contacts are tested at least partly tested in parallel in the respective groups.

7. A computer program containing program code means for performing the steps of claim 5, when said program is run on a computer.

8. A computer-readable storage means storing a computer program containing program code means for performing the steps of claim 5, when said program is run on a computer.

* * * * *